United States Patent
Hsin et al.

(10) Patent No.: US 8,923,790 B2
(45) Date of Patent: Dec. 30, 2014

(54) WIRELESS COMMUNICATION RECEIVER AND METHOD THEREOF

(71) Applicant: Realtek Semiconductor Corp., Hsinchu (TW)

(72) Inventors: Chien-Wei Hsin, Kaohsiung (TW); Chung-Yao Chang, Zhubei (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/762,595

(22) Filed: Feb. 8, 2013

(65) Prior Publication Data

US 2013/0203370 A1  Aug. 8, 2013

(30) Foreign Application Priority Data

Feb. 8, 2012  (TW) .............. 101104119 A

(51) Int. Cl.
| | |
|---|---|
| H04B 1/06 | (2006.01) |
| H04B 7/00 | (2006.01) |
| H03G 3/20 | (2006.01) |
| H03G 3/30 | (2006.01) |

(52) U.S. Cl.
CPC ............... *H03G 3/20* (2013.01); *H03G 3/3068* (2013.01); *H03G 3/3078* (2013.01)
USPC ........ 455/240.1; 455/260; 455/323; 455/334; 375/345

(58) Field of Classification Search
USPC ........ 455/234.1, 323, 334, 230, 232.1, 240.1, 455/256–260, 313; 375/345
See application file for complete search history.

(56) References Cited

U.S. PATENT DOCUMENTS

| | | | |
|---|---|---|---|
| 7,369,832 B2* | 5/2008 | Cho .......................... | 455/276.1 |
| 7,634,241 B2* | 12/2009 | Bagchi ...................... | 455/188.1 |
| 7,796,952 B1* | 9/2010 | Jin et al. ..................... | 455/73 |
| 7,916,798 B2* | 3/2011 | Aytur et al. .................. | 375/260 |
| 7,970,367 B1* | 6/2011 | Groe ........................... | 455/133 |
| 2004/0162043 A1* | 8/2004 | Taubenheim et al. ......... | 455/136 |
| 2011/0117868 A1* | 5/2011 | Vahidfar et al. ........... | 455/226.2 |

FOREIGN PATENT DOCUMENTS

TW  200501600  1/2005

OTHER PUBLICATIONS

CN Office Action dated Aug. 28, 2014.

* cited by examiner

*Primary Examiner* — Nhan Le
(74) *Attorney, Agent, or Firm* — McClure, Qualey & Rodack, LLP

(57) ABSTRACT

A wireless communication receiver includes a circuit, an analog-to-digital converter (ADC) and a processing circuit. The circuit receives a wireless signal and outputs an analog signal according to a gain index. The ADC converts the analog signal to a digital signal. The processing circuit adjusts the gain index according to a clipping number of the ADC.

17 Claims, 9 Drawing Sheets

US 8,923,790 B2

WIRELESS COMMUNICATION RECEIVER AND METHOD THEREOF

This application claims the benefit of Taiwan application Serial No. 101104119, filed Feb. 8, 2012, the subject matter of which is incorporated herein by reference.

BACKGROUND OF THE INVENTION

1. Field of the Invention

The invention relates in general to a wireless communication system, and more particularly to a wireless communication receiver and an auto gain control (AGC) method thereof.

2. Description of the Related Art

FIG. 1 shows a schematic diagram of a conventional wireless communication receiver. Referring to FIG. 1, a conventional wireless communication receiver 1 includes an antenna 11, a low noise amplifier (LNA) 121, a down-converting circuit 123, a filter 124, a variable gain amplifier (VGA) 125, an analog-to-digital converter (ADC) 13, a processing circuit 14, and a received signal strength indicator (RSSI) circuit 15. The processing circuit 14 includes an auto gain control (AGC) circuit 142, which includes a storage unit 1421 for storing an RSSI mapping table.

The ADC 13 and the processing circuit 14 are configured to process an amplitude range of an input signal. When the amplitude of the input signal is not appropriately controlled (adjusted), the amplitude range processed by the ADC 13 may not be effectively utilized if the signal strength received is too weak. In contrast, a signal will be clipped by the ADC 13 if the signal strength received is too strong such that the conversion of the ADC 13 and demodulation of the processing circuit 14 have undesirable effect.

Therefore, amplitude of a wireless signal is appropriately amplified or reduced through the AGC circuit 142 to satisfy processing amplitude range of the ADC 13 and the processing unit 14. In a conventional solution, the amplitude of the wireless signal is adjusted in coordination with the RSSI circuit 15 and the RSSI mapping table, inferring that design costs of the chip are increased due to the storage unit 1421 for storing the RSSI mapping table and the RSSI circuit 15.

SUMMARY OF THE INVENTION

One of embodiments of wireless communication receivers is disclosed. The wireless communication receiver includes a circuit, for receiving a wireless signal and outputting an analog signal according to a gain index; an analog-to-digital converter (ADC), for converting the analog signal to a digital signal; and a processing circuit, for adjusting the gain index according to a clipping number of the ADC.

One of embodiments of AGC methods for a wireless communication receiver is disclosed. The wireless communication receiver includes an RF circuit and an ADC. The AGC method includes steps of: receiving a wireless signal; converting the wireless signal to output an analog signal according to a gain index; converting the analog signal to a digital signal by an analog-to-digital converter (ADC); and adjusting the gain index according to a clipping number of the ADC.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
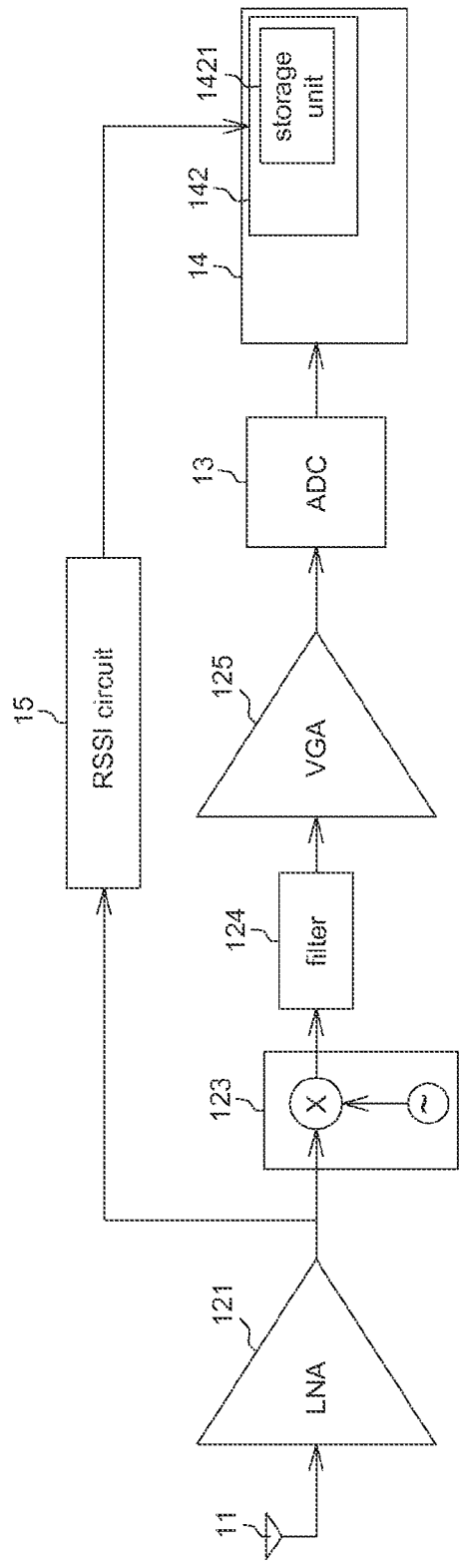
FIG. 1 is a schematic diagram of a conventional wireless communication receiver.
Figure 2:
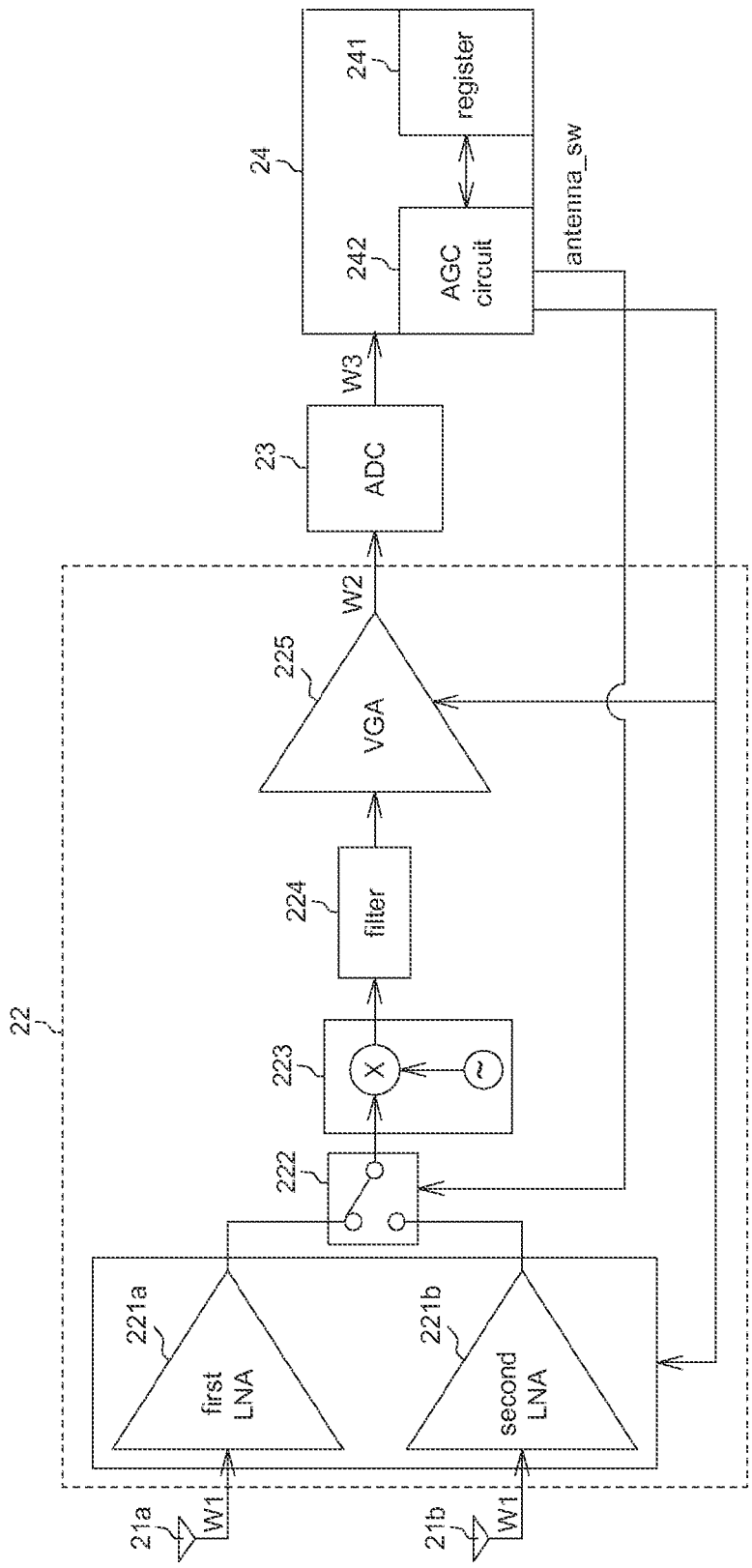
FIG. 2 is a schematic diagram of a wireless communication receiver according to an embodiment of the present invention.
Figure 3:
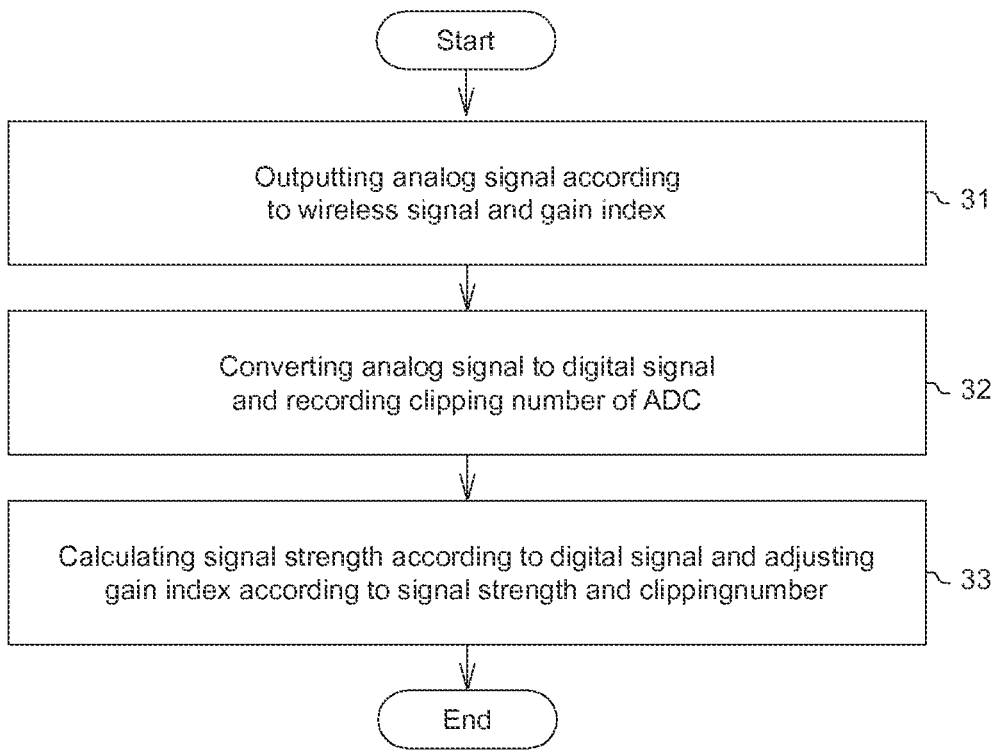
FIG. 3 is a flowchart of an auto gain control (AGC) method for a wireless communication receiver according to an embodiment of the present invention.

FIG. 2 shows a schematic diagram of a wireless communication receiver according to an embodiment of the present invention. FIG. 3 shows a flowchart of an auto gain control (AGC) method for a wireless communication receiver according to an embodiment of the present invention. Referring to FIGS. 2 and 3, a wireless communication receiver 2 includes a predetermined antenna 21a, a selected antenna 21b, a radio frequency (RF) circuit 22, an analog-to-digital converter (ADC) 23, and a processing circuit 24. For example, the RF circuit 22 is an integrated circuit, and the processing circuit 24 is a digital signal processing (DSP) circuit or a baseband circuit.

The RF circuit 22 includes a first low noise amplifier (LNA) 221a, a second LNA 221b, an LNA switch 222, a down-converting circuit 223, a filter 224 and a variable gain amplifier (VGA) 225. The processing circuit 24 includes a clipping number register 241 and an AGC circuit 242.

The first LNA 221a and the second LNA 221b are electrically coupled to the predetermined antenna 21a and the selected antenna 21b, respectively, and are controlled by the gain index. The switch 222 is for switching between the first LNA 221a and the second LNA 221b. The down-converting circuit 223 is electrically connected to the LNA switch 222, and the filter 224 is electrically connected to the down-converting circuit 223. The VGA 225 is electrically connected to the filter 224 and the ADC 23. It should be noted that different circuits may be designed to adapt to different circuit design requirements. For example, the selected antenna 21b, the second LNA 221b and the switch 222 may be omitted in an alternative embodiment. In other words, a control signal and a corresponding control mechanism may also be correspondingly omitted.

The AGC method for the wireless communication receiver 2 according to an embodiment includes the following steps. In Step 31, the RF circuit 22 receives a wireless signal W1, and outputs an analog signal W2 according to the wireless signal W1 and a gain index Mp_gain_idex. In Step 32, the ADC 23 converts the analog signal W2 to a digital signal W3, and the register 241 records a clipping number of the ADC 23 within a predetermined time interval. In Step 33, the AGC circuit 242 calculates a signal strength AGC_Pk_dB according to the digital signal W3, and adjusts the gain index Mp_gain_idex according to the signal strength AGC_Pk_dB and the clipping number of the ADC 23.

Figure 4:
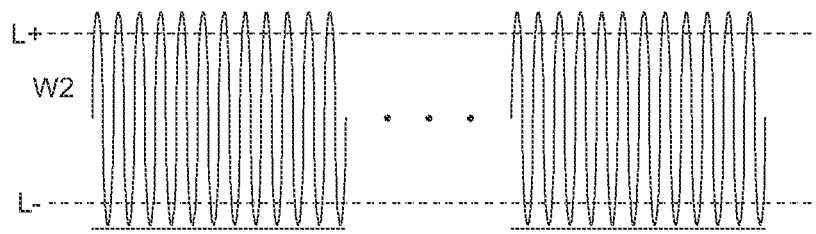
FIG. 4 is a schematic diagram of an ADC clipping an analog signal.

FIG. 4 shows a schematic diagram of an ADC clipping an analog signal. With reference to FIGS. 2 and 4, the ADC 23 has a quantization operating interval between an input upper limit L+ and an input lower limit L−. When the analog signal W2 exceeds the quantization operating interval, the digital signal W3 becomes saturated at a maximum output value or a minimum output value of the ADC 23. Therefore, the clipping number is equivalently regarded as the number that the analog signal W2 exceeds the quantization operating interval.

When the clipping number is 0, it means that the analog signal W2 is within the quantization operating interval (i.e., non-saturated). When the clipping number is not equal to 0 and a ratio between the clipping number and a predetermined number is greater than a clipping ratio, it means the analog signal W2 is severely saturated after being converted by the ADC 23. For example, assume that predetermined number is 16 and the clipping ratio is ½. It should be noted that the predetermined time interval, the predetermined number and the clipping ratio may be adjusted and changed according to actual requirements. When the clipping number is not 0 and the ratio between the clipping number and the predetermined number is not greater than the clipping ratio, it means the analog signal W2 still exceeds the quantization operating interval, with the analog signal W2 however being mildly saturated after being converted by the ADC 23. When the ratio between the clipping number and the predetermined number is greater than the clipping ratio, it means the analog signal W2 is severely saturated after being converted by the ADC 23. Since the clipping number is proportional to the saturation level of ADC 23, the clipping number may also serve as basis for determining the saturation level of the ADC 23 instead of using the clipping ratio.

In this embodiment, the clipping number is utilized as basis of the saturation level of the analog signal W2 after the analog signal W2 is converted by the ADC 23, and a wireless signal can be appropriately amplified or reduced according to the clipping number. It should be noted that, instead of being divided into three saturation levels as in the above example, the saturation of the ADC 23 may be divided into a greater number of saturation levels, e.g., non-saturated, extremely mildly saturated, mildly saturated, intermediately saturated, severely saturated, and extremely severely saturated. Without departing from the spirit and scope of the present invention, various modifications may be made to the saturation levels of the ADC 23.

Several embodiments are to be described below for better explaining details of the present invention to a person having ordinary skill in the art, and are not to be construed as limitations of the present invention.

First Embodiment

Figure 5:
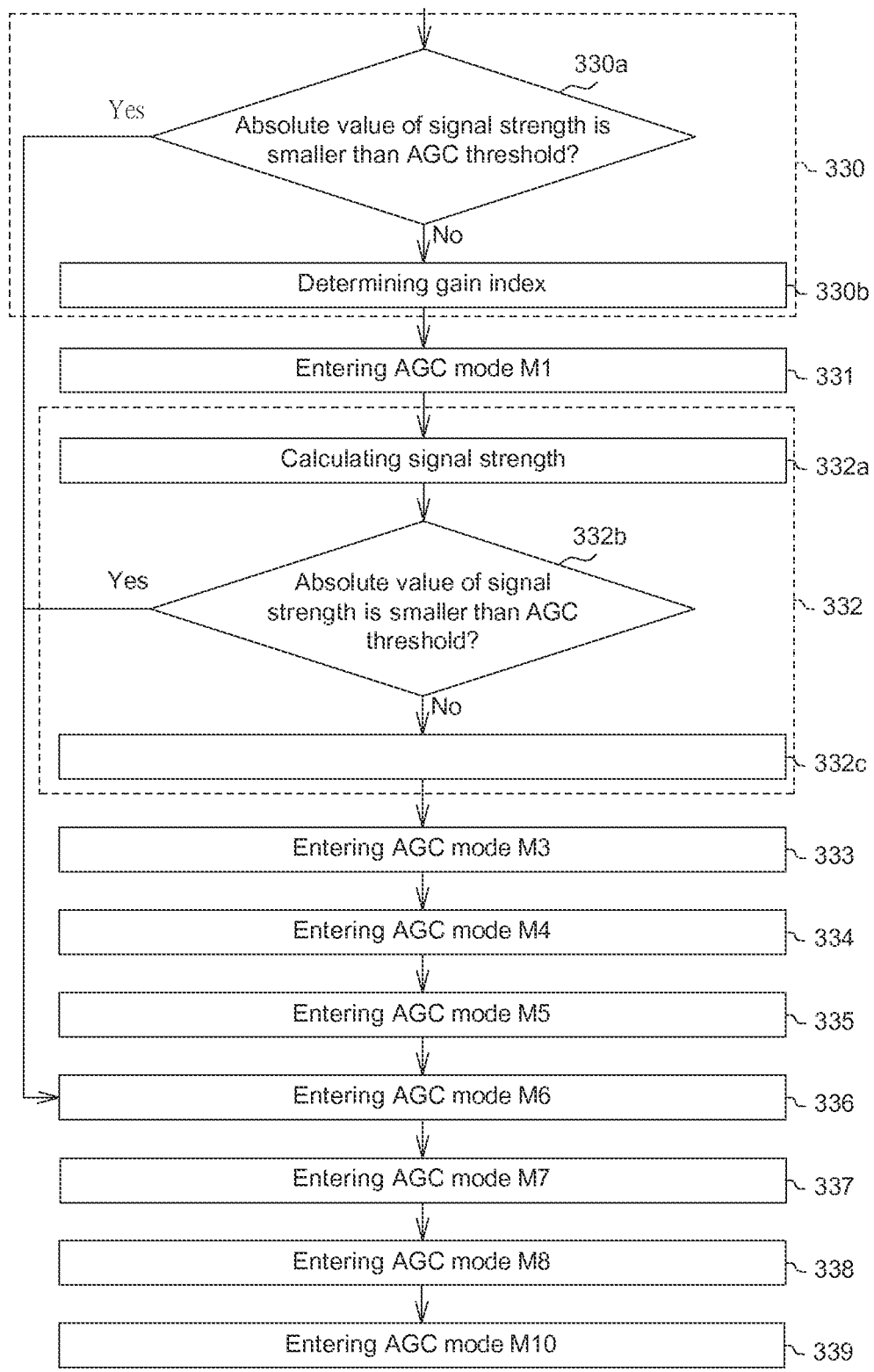
FIG. 5 is a first detailed flowchart of Step 33 in FIG. 3.
Figure 6:
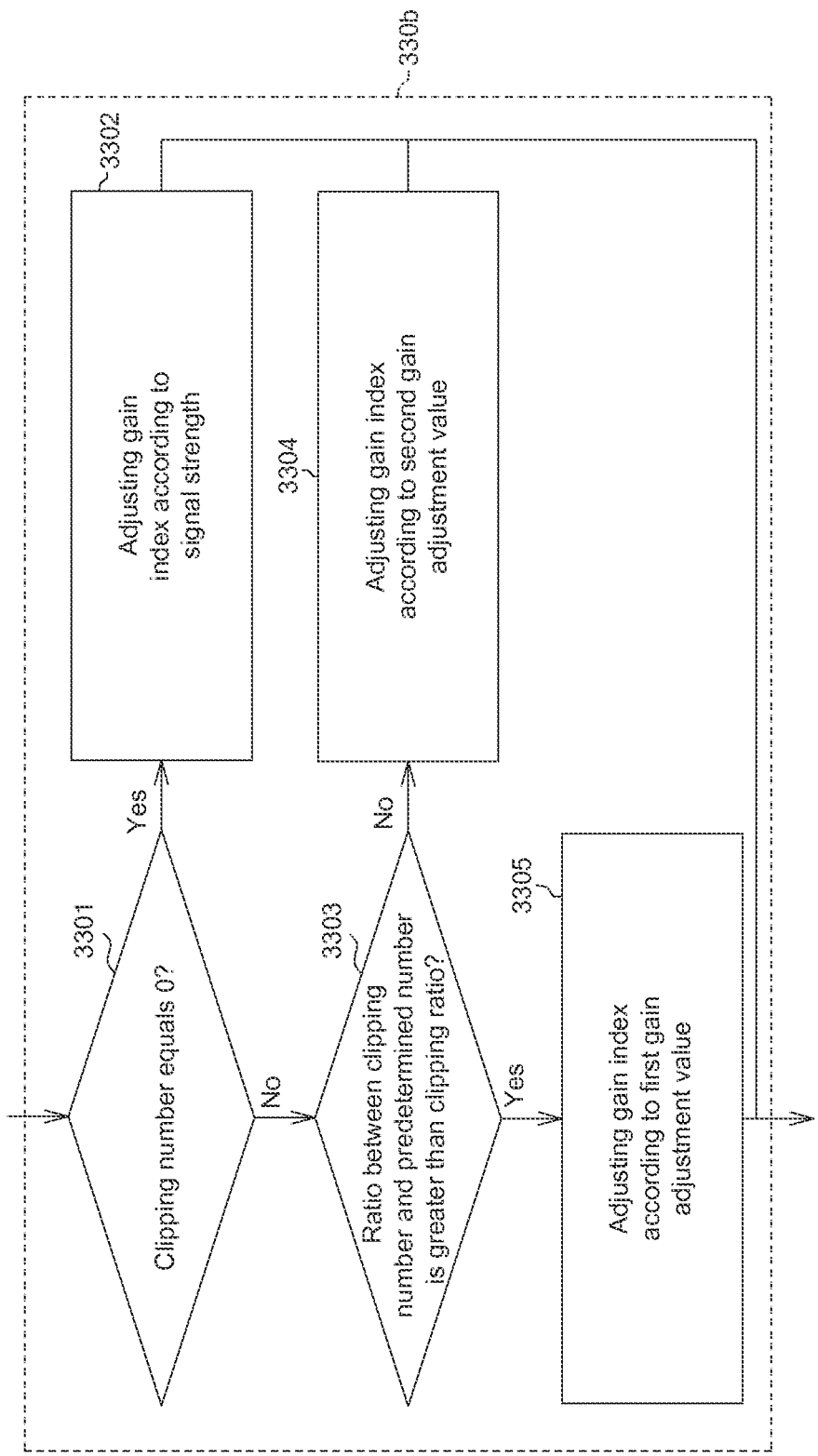
FIG. 6 is a detailed flowchart of Step 330b in FIG. 5.

FIG. 5 shows a first detailed flowchart of Step 33 and FIG. 6 shows a detailed flowchart of Step 330 according to the first embodiment of the present invention. Referring to FIGS. 2, 5 and 6, Step 33 includes Steps 330 to 339, which respectively indicate an AGC mode M0, an AGC mode M1, an AGC mode M2, an AGC mode M3, an AGC mode M4, an AGC mode M5, an AGC mode M6, an AGC mode M7, an AGC mode M8 and an AGC mode M10.

The AGC mode M0 is time reserved for the AGC circuit 242 to determine whether the signal strength AGC_Pk_dB converges and determine the gain index. The AGC mode M1, the AGC mode M3, the AGC mode M5 and the AGC mode M7 are time reserved for the first LNA 221a, the second LNA 221b and the VGA 225 to perform gain adjustment. The AGC mode M2, the AGC mode M4 and the AGC mode M6 are time reserved for the AGC circuit 242 to calculate the signal strength AGC_Pk_dB, determine whether the signal strength AGC_Pk_dB converges and determine the gain index.

Step 330 includes Steps 330a and 330b. As shown in Step 330a, the AGC circuit 242 determines whether an absolute value of the signal strength AGC_Pk_dB is smaller than an AGC threshold agc_th. When the signal strength AGC_Pk_dB is smaller than the AGC threshold agc_th, it means the signal strength AGC_Pk_dB is converged, and Step 337 is performed. Step 338 is then performed to enter the AGC mode M8. The AGC mode M8 is time reserved for the filter to switch from a high cut-off frequency to a low cut-off frequency. In Step 339, the process enters the AGC mode M10, which indicates the AGC process is complete.

Step 330b is performed when the absolute value of the signal strength AGC_Pk_dB is not smaller than the AGC threshold agc_th. Step 330b is for determining the gain index Mp_gain_idex, and includes Steps 3301 to 3305. The processing circuit 24 adjusts the gain index according to a signal strength of the wireless signal when the clipping number of the ADC 23 is smaller than a predetermined threshold. As shown in Step 3301, the AGC circuit 242 determines whether the clipping number clip_num is 0. When the clipping number clip_num is 0, Step 3302 is performed, in which the AGC circuit 242 adjusts the gain index Mp_gain_idex according to the signal strength AGC_Pk_dB.

Conversely, when the clipping number clip_num is not equal to 0, Step 3303 is performed. In Step 3303, the AGC circuit 242 further determines whether a ratio between the clipping number clip_num and the predetermined number is greater than a clipping ratio. In the first embodiment, for example, the predetermined number is 16, and the clipping ratio is ½. The processing circuit 24 uses a first gain adjustment value gain_big_jump or a second gain adjustment value gain_small_jump to adjust the gain index according to the clipping number clip_num of the ADC 23.

When the clipping number clip_num is not equal to 0 and the ratio between the clipping number clip_num and the predetermined number is greater than the clipping ratio, Step 3305 is performed. In Step 3305, the AGC circuit 242 adjusts the gain index Mp_gain_idex according to a first gain adjustment value gain_big_jump.

When the clipping number clip_num is not equal to 0 and the ratio between the clipping number clip_num and the predetermined number is not greater than the clipping ratio, Step 3304 is performed. In Step 3304, the AGC circuit 242 adjusts the gain index Mp_gain_idex according to a second gain adjustment value gain_small_jump. The first gain adjustment value gain_big_jump is greater than the second gain adjustment value gain_small_jump.

The AGC circuit 242 sends the gain index Mp_gain_idex determined in the AGC mode M0 to the first LNA 221a, the second LNA 221b and the VGA 225 of the RF circuit 22 to perform gain adjustment. In Step 331, the process enters the AGC mode M1. In Step 331 of the AGC mode M1, the first LNA 221a, the second LNA 221b and the VGA adjust the gain to a stable state.

In Step 332, the process enters the AGC mode M2. Step 332 includes Steps 332a, 332b and 332c. Steps 332b and 332c are respectively the same as Steps 330a and 330b. In Step 332a, the AGC circuit 242 calculates the signal strength AGC_Pk_dB having the adjusted gain.

Step 332b is similar to Step 330a. In Step 332b, the AGC circuit 242 determines whether the absolute value of the signal strength AGC_Pk_dB having the adjusted gain is smaller than the AGC threshold agc_th. When the signal strength AGC_Pk_dB is smaller than the AGC threshold agc_th, it means the signal strength AGC_Pk_dB having the adjusted gain is converged, and Step 337 is performed. Step 338 is then performed to enter the AGC mode M8.

Step 332c is performed when the absolute value of the signal strength AGC_Pk_dB is not smaller than the AGC threshold agc_th. Step 332c is similar to Step 330b—the AGC circuit 242 determines the gain index Mp_gain_idex. Details of Step 332c are the same as those of Steps 3301 and 3305, and shall be omitted herein.

The AGC circuit 242 sends the gain index Mp_gain_idex determined in the AGC mode M2 to the first LNA 221a, the second LNA 221b and the VGA 225 of the RF circuit 22 to perform gain adjustment. In Step 333, the process enters the AGC mode M3. In Step 331 of the AGC mode M3, the first LNA 221a, the second LNA 221b and the VGA adjust the gain to a stable state.

Details of the AGC mode M5 and the AGC mode M7 are the same as those of the AGC mode M3, and shall be omitted herein. Similarly, details of the AGC mode M4 and the AGC mode M6 are the same as those of the AGC mode M2, and shall also be omitted herein.

In a worst case, the adjustment process of the AGC needs to adjust the gain for four times. With respect to a current radio frequency end (RFE) technique, the time of a 300 ns-period reserved for the first LNA 221a, the second LNA 22ab and the VGA 225 for gain adjustment is sufficient for adjusting the gain to a stable state. Thus, in a worse case, the AGC circuit 242 needs time for four times of gain adjustment, time for three times of signal strength calculation and time for switching the cut-off frequency. More specifically, in a worst case of gain adjustment, the AGC circuit 242 needs 300×4+800×3+200=3.8 µs<4 µs. Accordingly, with the remaining time, the processing circuit 24 is given sufficient time to further perform carrier frequency offset estimation and symbol boundary detection using remaining short preamble packets.

Figure 7:
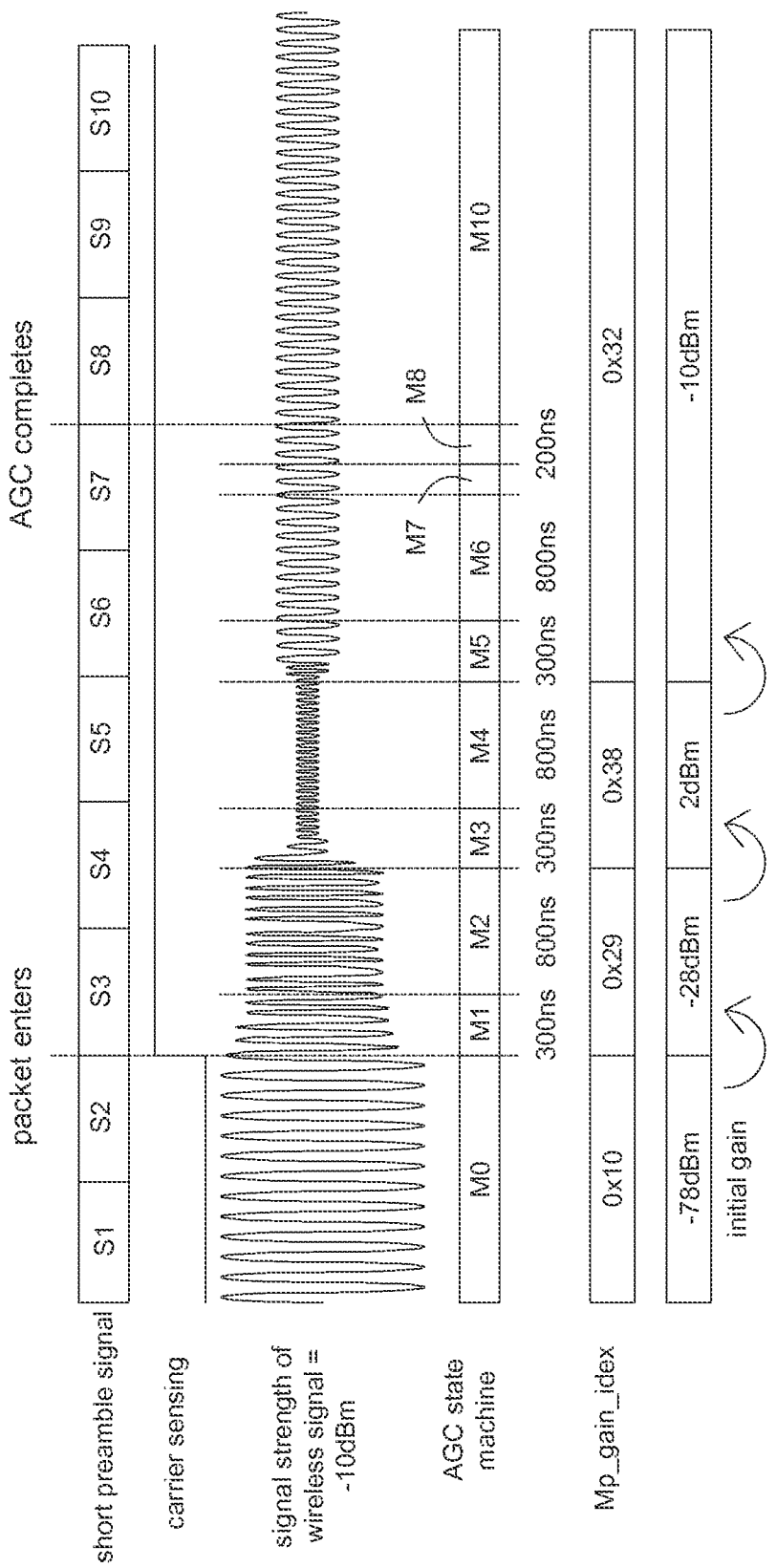
FIG. 7 is a timing diagram of AGC.

FIG. 7 shows a timing diagram of AGC. To better explain the above contents, in the description below, assume that an initial gain and the signal strength of the wireless signal W1 are respectively −78 dBm and −10 dBm, and the initial gain −78 dBm corresponds to a gain index Mp_gain_idex of 0x10. Referring to FIGS. 2, 4, and 7, the wireless communication receiver 2 first enters the AGC mode M0 upon detecting a packet, and adjusts the gain index Mp_gain_idex from 0x10 to 0x29 according to the first gain adjustment value gain_big_jump. For example, the first gain adjustment value gain_big_jump at this point is 50 dBm. After entering the AGC mode M1, the first LNA 221a, the second LNA 221b and the VGA 225 adjust the gain from −78 dBm to −28 dBm.

In the next AGC mode M2, the saturation level of the ADC 23 is still considered rather severe since −28 dBm is quite large compared to −10 dBm. In the AGC mode M2, it is determined to adjust the gain index Mp_gain_idex from 0x29 to 0x38 according to the first gain adjustment value gain_big_jump. It should be noted that, in the foregoing AGC mode M0, the first gain adjustment value gain_big_jump may be set to a greater value such as 50 dBm because the gain index Mp_gain_idex is changed for the first time. In subsequent modifications of the gain index Mp_gain_idex, the first gain adjustment value gain_big_jump may be changed to a smaller value such as 30 dBm. In the next AGC mode M3, the first LNA 221a, the second LNA 221b and the VGA 225 adjust the gain from −28 dBm to 2 dBm.

In the next AGC mode M4, in response to the clipping number clip_num equal to 0, the AGC circuit 242 adjusts the gain index Mp_gain_idex from 0x38 to 0x32 according to the signal strength AGC_Pk_dB. In the next AGC mode M5, the first LNA 221a, the second LNA 221b and the VGA 225 adjust the gain from 2 dBm to −10 dBm, i.e., the target gain.

In the next AGC mode M6, the AGC M7 is directly entered since the target gain −10 dBm is already reached. In the next AGC mode M8, the filter switches from the high cut-off frequency to the low cut-off frequency. The final AGC mode 10 is entered to complete the process of AGC.

Second Embodiment

Figure 8A:
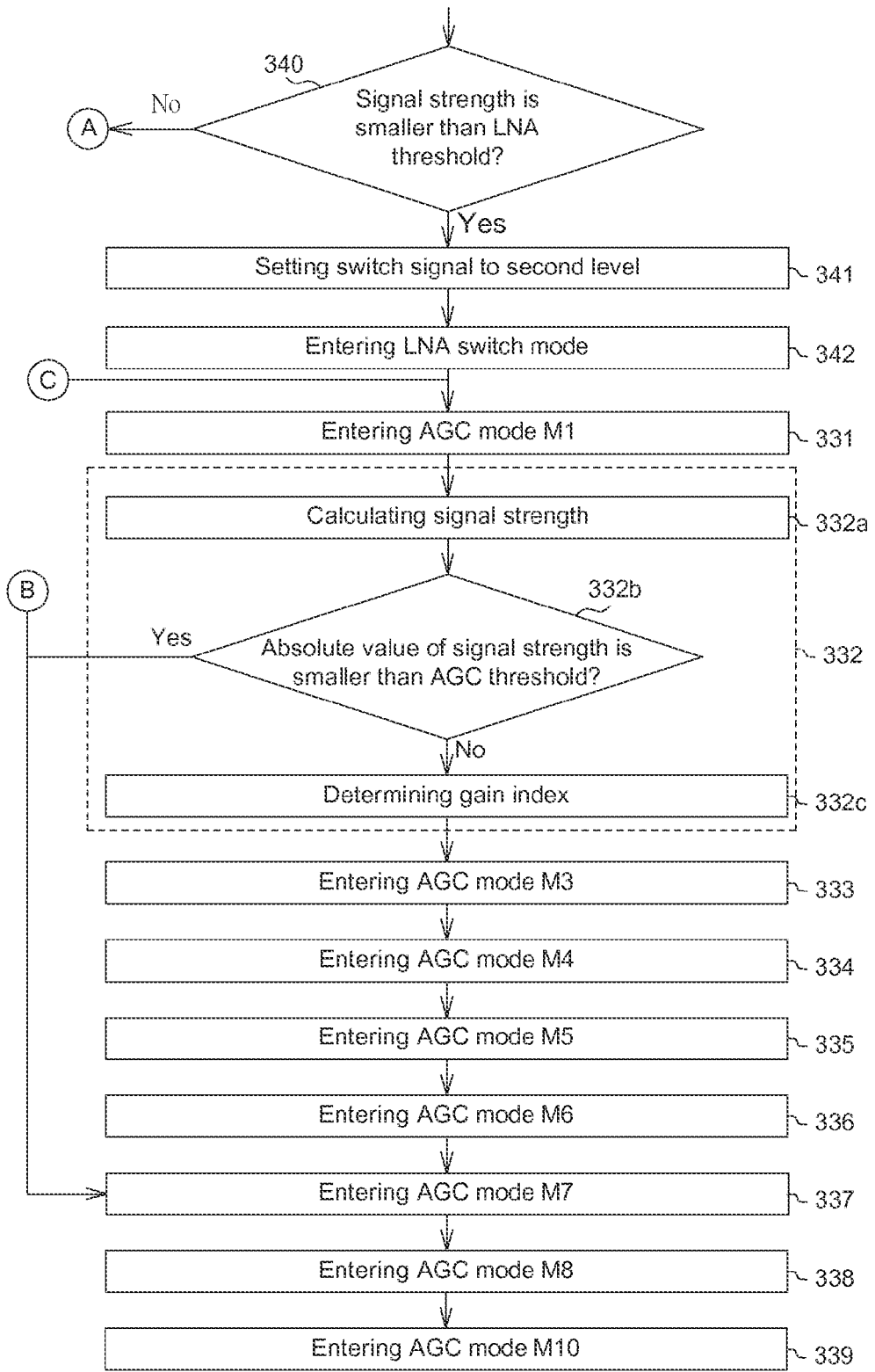
FIGS. 8A and 8B are second detailed flowcharts of Step 33 in FIG. 3.
Figure 8B:
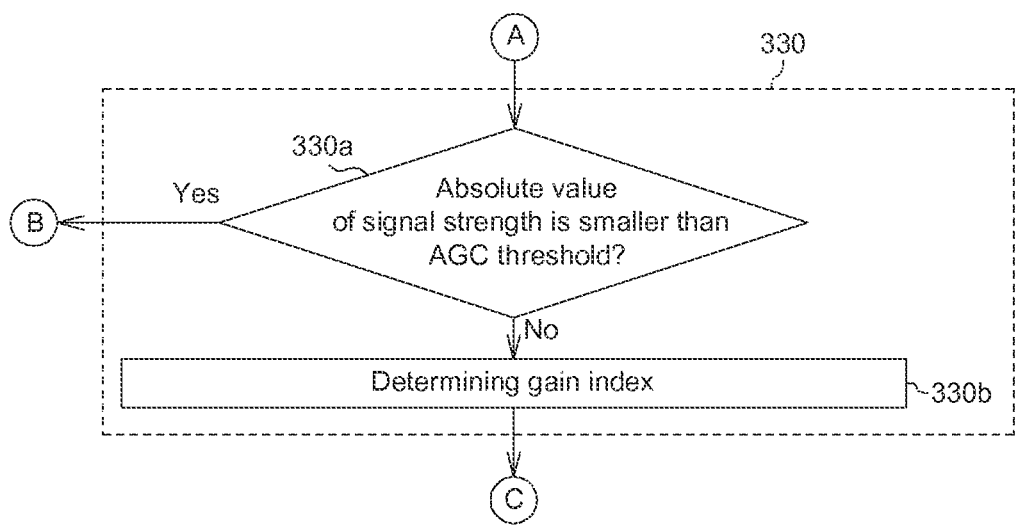
Figure 9:
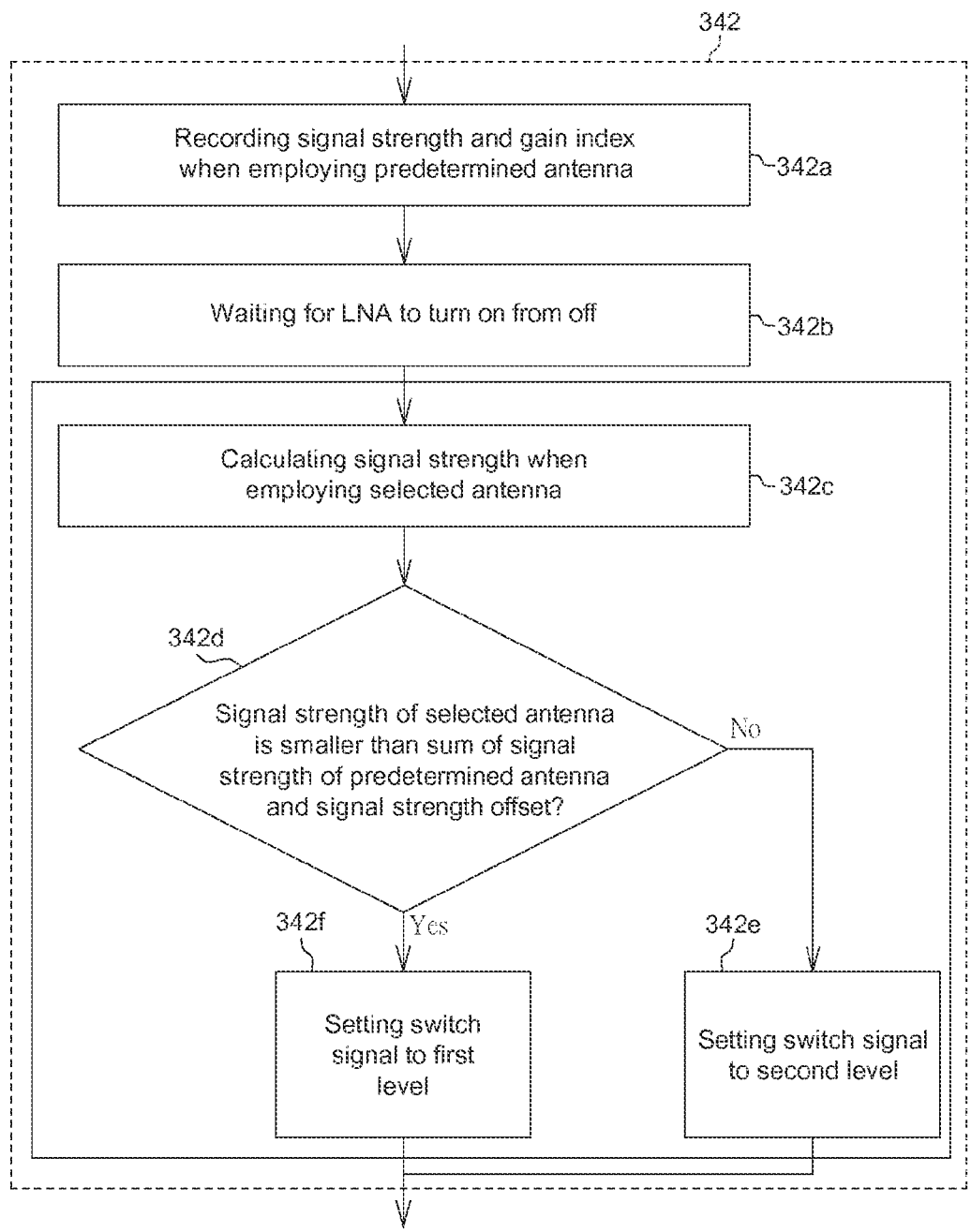
FIG. 9 is a detailed flowchart of Step 342 in FIG. 8A.

FIGS. 8A and 8B show second detailed flowcharts of Step 33, and FIG. 9 shows a detailed flowchart of Step 342 according to a second embodiment. A main difference between the second embodiment and the first embodiment is that, the second detailed flowchart further includes Steps 340 to 342. In Step 340, it is determined whether the signal strength AGC_Pk_dB is smaller than a switch threshold LNAsw_p-wdB_th. Due to the predetermined antenna initially employed, the signal strength AGC_Pk_dB at this point is a signal strength AGC_Pk_dB0 at the time when employing the predetermined antenna 21a. When the signal strength of the predetermined antenna 21a is not smaller than the switch threshold LNAsw_pwdB_th, it means that reception quality of the predetermined antenna 21a is satisfactory, and Step 330 is performed.

Conversely, when the signal strength AGC_Pk_dB0 at the time when employing the predetermined antenna 21a is smaller than the LNAsw_pwdB_th, it means the reception quality of the predetermined antenna 21a is poor, and Step 341 is performed. In Step 341, the AGC circuit 242 sets a switch signal antenna_sw to a second level to switch to the selected antenna 21b. That is, the AGC circuit 242 controls the switch 222 to switch to the second LNA 221b. The process then enters an LNA switch mode in Step 342.

Step 342 includes Steps 342a to 342f. In Step 342a, the AGC circuit 242 records the signal strength AGC_Pk_dB0 and the gain index Mp_gain_idex0 at the time when employing the predetermined antenna 21a. In Step 342b, it is waited until the second LNA 221b turns on from off. In Step 342c, the AGC circuit 242 calculates the signal strength AGC_Pk_dB1 at the time when employing the selected antenna 21b. In Step 342d, the AGC circuit 242 determines whether the signal strength AGC_Pk_dB1 at the time when employing the selecting antenna 21b is smaller than a sum of the signal strength AGC_Pk_dB0 corresponding to the predetermined antenna 21a and a signal strength offset LNAsw_pwdB_bias. That is, the AGC circuit 242 determines which between the predetermined antenna 21a and the selected antenna 21b has preferred reception quality.

When the signal strength AGC_Pk_dB1 at the time when employing the selected antenna 21b is smaller than the sum of the signal strength AGC_Pk_dB0 at the time when employing the predetermined antenna 21a and the signal strength offset LNAsw_pwdB_bias, Step 342f is performed. In Step 342f, the AGC circuit 242 sets the switch signal antenna_sw to a first level to switch back to the predetermined antenna 21a. That is, the AGC circuit 242 controls the switch 222 to switch to the first LNA 221a. The gain index Mp_gain_idex equals the gain index Mp_gain_idex0 at the time when employing the predetermined antenna 21a. Conversely, when the signal strength AGC_Pk_dB1 at the time when employing the selected antenna 21b is not smaller than the sum of the signal strength AGC_Pk_dB0 at the time when employing the predetermined antenna 21a and the signal strength offset LNAsw_pwdB_bias, Step 342e is performed. In Step 342e, the AGC circuit 242 maintains the switch signal antenna_sw at the second level to keep employing the selected antenna. That is, the AGC circuit 242 still controls the switch 222 to switch to the second LNA 221b. The AGC circuit 242 adjusts the gain index Mp_gain_idex according to the signal strength AGC_Pk_dB1.

In other words, the selected antenna 21b is only selected when the signal strength AGC_Pk_dB1 is greater than the sum of the signal strength AGC_Pk_dB0 and the signal strength offset LNAsw_pwdB_bias, or else the AGC circuit 242 switches back to the predetermined antenna 21a. Thus, when the predetermined antenna 21a has poor reception quality, a preferred reception effect can be obtained by switching to the selected antenna 21b.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wireless communication receiver, comprising:
    a circuit, for receiving a wireless signal and outputting an analog signal according to a gain index;
    an analog-to-digital converter (ADC), for converting the analog signal to a digital signal; and
    a processing circuit, for adjusting the gain index according to a clipping number of the ADC;
    wherein the ADC has a quantization operating interval, the clipping number indicates the number of times that the analog signal exceeds the quantization operating interval.

2. The receiver of claim 1, wherein the processing circuit adjusts the gain index according to a signal strength of the wireless signal when the clipping number of the ADC is smaller than a predetermined threshold.

3. The receiver of claim 1, wherein the processing circuit uses a first gain adjustment value or a second gain adjustment value to adjust the gain index according to the clipping number of the ADC.

4. The receiver of claim 1, further comprising:
    a first low noise amplifier (LNA) and a second LNA;
    a switch, coupled to the first LNA and the second LNA, being controlled by a switch signal from the processing circuit.

5. The receiver of claim 4, wherein the processing circuit determines whether the signal strength when employing a first antenna is smaller than a switch threshold, and controls the switch to switch to the second LNA when the signal strength when employing the first antenna is smaller than the switch threshold.

6. The receiver of claim 5, wherein the processing circuit records the signal strength and a predetermined gain index when employing the first antenna, calculates the signal strength when employing a second antenna after turning on the second LNA from off, and controls the switch to switch to the first LNA when the signal strength when employing the second antenna is smaller than a sum of the signal strength when employing the first antenna and a signal strength offset.

7. The receiver of claim 6, wherein the processing circuit controls the switch to switch to the second LNA when the signal strength when employing the second antenna is not smaller than the sum of the signal strength when employing the first antenna and the signal strength offset.

8. The receiver of claim 1, the processing circuit comprising:
    a storage unit to record the clipping number of the ADC; and
    an auto gain control (AGC) circuit to adjust the gain index according to the clipping number of the ADC.

9. The receiver of claim 1, wherein the processing circuit adjusts the gain index according to a signal strength when the clipping number of the ADC equals 0.

10. A method for a wireless communication receiver, the method comprising:
    receiving a wireless signal;
    converting the wireless signal to output an analog signal according to a gain index;
    converting the analog signal to a digital signal by an analog-to-digital converter (ADC); and
    adjusting the gain index according to a clipping number of the ADC;
    wherein the ADC has a quantization operating interval, the clipping number indicates the number of times that the analog signal exceeds the quantization operating interval.

11. The method of claim 10, wherein the adjusting step comprises:
    adjusting the gain index according to a signal strength of the wireless signal when the clipping number of the ADC is smaller than a threshold value.

12. The method of claim 10, wherein the adjusting step comprises:
    adjusting the gain index according to a signal strength of the wireless signal when the clipping number of the ADC equals 0.

13. The method of claim 10, wherein the adjusting step comprises:
    determining a first gain adjustment value or a second gain adjustment value to adjust the gain index according to the clipping number.

14. The method of claim 10, wherein the wireless communication receiver further comprises:
    a first antenna and a second antenna;
    a first LNA, coupled to the first antenna, being controlled by the gain index;
    a second LNA, coupled to the second antenna, being controlled by the gain index; and
    a switch, coupled to the first LNA and the second LNA, being controlled by a switch signal.

15. The method of claim 14, further comprising:
    controlling the switch to switch to the second LNA when the signal strength when employing the first antenna is smaller than the switch threshold.

16. The method of claim 14, further comprising:
    recording the signal strength and the predetermined gain index when employing the first antenna, and calculating the signal strength when employing selected second antenna after turning on the second LNA is turned from off;
    determining whether the signal strength when employing the second antenna is smaller than a sum of the signal strength when employing the first antenna and a signal strength offset; and
    controlling the switch to switch to the first LNA when the signal strength of the second antenna is smaller than the sum of the signal strength when employing the first antenna and the signal strength offset.

17. The method of claim 14, further comprising:
    controlling the switch to switch to the second LNA when the signal strength when employing the second antenna is not smaller than the sum of the signal strength when employing the first antenna and the signal strength offset.

* * * * *